United States Patent [19]

Anastassiou

[11] Patent Number: 4,926,180

[45] Date of Patent: May 15, 1990

[54] ANALOG TO DIGITAL CONVERSION USING CORRELATED QUANTIZATION AND COLLECTIVE OPTIMIZATION

[75] Inventor: Dimitris Anastassiou, New York, N.Y.

[73] Assignee: Trustees of Columbia University in the City of New York, New York, N.Y.

[21] Appl. No.: 173,441

[22] Filed: Mar. 25, 1988

[51] Int. Cl.$^5$ .............................................. H03M 1/36
[52] U.S. Cl. .................................... 341/159; 341/125; 307/201; 364/602
[58] Field of Search ............... 341/155, 158, 159, 161, 341/166, 170, 200, 143, 122, 125; 364/513, 600, 602, 800, 801, 802, 807, 135, 178, 148, 149; 307/201; 365/49

[56] References Cited

U.S. PATENT DOCUMENTS

| 4,660,166 | 4/1987 | Hopfield | 364/807 |
| 4,807,168 | 2/1989 | Moonpenn et al. | 364/602 |
| 4,866,645 | 9/1989 | Lish | 364/602 |

FOREIGN PATENT DOCUMENTS 0223468  5/1987  European Pat. Off. .

OTHER PUBLICATIONS

David W. Tank et al., "Simple 'Neural' Optimization Networks: An A/D Converter, Signal Decision Circuit, and a Linear Programming Circuit", IEEE Transactions on Circuits and Systems, vol. Cas-33, No. 5, May 1986, pp. 533-541.

Y. P. Tsividis et al., "Switched-Capacitor Neural Networks", Electronic Letters, vol. 23, No. 18, Aug. 27, 1987, pp. 958-959.

Primary Examiner—William M. Shoop, Jr.
Assistant Examiner—Brian K. Young
Attorney, Agent, or Firm—Brumbaugh, Graves, Donohue & Raymond

[57] ABSTRACT

A 1-bit nonstandard A/D converter for converting a block u of N samples of a continuous time analog signal u(t) into N corresponding 1-bit binary values x, such that a distortion measure of the form $d(u,x) = (Au-Bx)^T(Au-Bx)$ is minimized, is implemented with an N-input parallel sample-and-hold circuit and a neural network having N nonlinear amplifiers, where u and x are n-dimensional vectors, and A and B are N×N matrices. Minimization of the above distortion measure is equivalent to minimizing the quantity $$\tfrac{1}{2}x^T B^T B x - u^T A^T B x,$$

which is achieved to at least a good approximation by the N-amplifier neural network. Accordingly, the conductances of the feedback connections among the amplifiers are defined by respective off-diagonal elements of the matrix $-B^T B$. Additionally, each amplifier of the neural network is connected to receive the analog signal samples through respective conductances defined by the matrix $B^T$. Furthermore, each amplifier receives a respective constant signal defined by the diagonal elements of the matrix $-B^T B$. The stabilized outputs of the N amplifiers are the binary values of the digital signal x.

A multiple-bit nonstandard A/D converter based on for foregoing 1-bit A/D converter is also disclosed.

32 Claims, 7 Drawing Sheets

ANALOG TO DIGITAL CONVERSION USING CORRELATED QUANTIZATION AND COLLECTIVE OPTIMIZATION

BACKGROUND OF THE INVENTION

The present invention relates to the quantization of sampled continuous-time analog signals to predefined discrete reconstruction levels for the purpose of representing the analog signals by digital codes and, more particularly, to the quantization of analog signal samples so as to minimize a distortion measure of the form $d(u,x)=(Au-Bx)^T(Au-Bx)$.

The quantization of an analog signal according to a predefined set of reconstruction levels can be considered as an optimization problem, in which a sampled continuous-time signal u is approximated by a discrete-amplitude signal x such that a distortion measure $d(x,u)$ is minimized with the constraint that the signal x can only take on values from a predefined set of discrete reconstruction levels. Here u and x are each N-dimensional vectors representing N samples of the continuous-time signal and N corresponding values of the discrete-amplitude signal, respectively, where N is an integer greater than one. Therefore, the values of the quantized signal x approximating the sampled analog signal u depend upon the choice of the distortion measure $d(x,u)$.

In standard analog-to-digital (A/D) conversion, in which each analog signal sample is independently mapped to its closest reconstruction level, the distortion measure $d(x,u)$ being minimized is typically the squared error $$(x - u)^T(x - u) = \sum_{i=i}^{N} (x_i - u_i)^2. \quad (1)$$

where the superscript T, as used in equation (1) and other mathematical expressions in the specification and claims, denotes the transpose of a matrix or vector. This squared error distortion measure has been found to be highly inappropriate for certain applications, such as sound or image coding, where the coded signal is to be ultimately presented for quality evaluation by human sensory perception. For applications involving human sensory perception, a quadratic distortion measure of the form $d(u,x)=(Au-Bx)^T(Au-Bx)$, where A and B are appropriately chosen $N\times N$ matrices, can provide appropriate fidelity criteria for the quantization of signals, since it can represent a frequency-weighted squared error taking into account the frequency dependence of the response of a sensory perception system. Accordingly, a need clearly exists for a nonstandard A/D conversion technique which provides for the quantization of analog signal samples according to a predefined set of discrete reconstruction levels, such that a distortion measure of the form $d(u,x)=(Au-Bx)^T(Au-Bx)$ is minimized.

Recently, there has been proposed A/D conversion using a network of nonlinear analog amplifiers which includes a weighting circuit for supplying a weighted sum of the output signals of certain other amplifiers and of certain external signals to the input of each amplifier. The signal supplied to the input of each amplifier is derived by applying a respective weighting factor to each output signal and each external signal to be included in the weighted sum, and taking the sum of the weighted signals.

The foregoing type of network is often referred to as a neural network because such networks are thought to model neural systems of the brains of animals. Neural networks having resistive weighting circuits useful for solving various types of problems are disclosed in U.S. Pat. No. 4,660,166 issued to John J. Hopfield on Apr. 21, 1987. The general structure of a known neural network with a resistive weighting circuit is illustrated in FIG. 1. The circuit 100 has N amplifiers $A_1$-$A_N$ each having a normal output $x_i$ and an inverted output $\bar{x}_i$, where $i=1, 2, \ldots, N$. The amplifiers each have a nonlinear input-output relation (i.e., transfer function) characterized by a monotonic sigmoid shape, as depicted in FIG. 2. The maximum and minimum levels for the normal output of each amplifier is taken as 0 and 1, respectively, while the corresponding levels for the inverted output is taken as 0 and $-1$. The sigmoid transfer function of FIG. 2 has a width defined as $2v_0$ as shown in the figure.

Referring again to FIG. 1, the outputs of each of the amplifiers $A_1$-$A_N$ of the neural network 100 are connected to the inputs of certain other amplifiers through a resistive weighting circuit 101, which comprises an array of resistors, each connecting one of the outputs of a particular amplifier to the input of another amplifier. Each resistor $R_{ij}$ connecting one of the outputs of an amplifier $A_j$ to the input of another amplifier $A_i$ serves to apply a weighting factor $W_{ij}$ to an output signal from amplifier $A_j$ before it is summed with other weighted signals and provided to the input of amplifier $A_i$, where i and j are independent integers having values $i=1, 2, \ldots, N$ and $j=1, 2, \ldots, N$. The relative value of each resistor $R_{ij}$ is defined by the relation $R_{ij}=1/|W_{ij}|$. If $W_{ij}$ is greater than zero, the resistor $R_{ij}$ is connected to the normal output of amplifier $A_j$, and if $W_{ij}$ is less than zero, the resistor $R_{ij}$ is connected to the inverted output of amplifier $A_j$. The connections between the inputs and outputs of the amplifiers $A_1$-$A_N$ of the neural network 100 may be defined by an $N\times N$ weighting matrix W having each weighting factor $W_{ij}$ as an element in a respective row and column thereof.

In addition to a weighted sum of output signals supplied by other amplifiers, each amplifier of the neural network 100 may also receive an external signal $I_i$ forming part of the weighted sum. The external signals $I_1$-$I_N$ may be constant signals and/or problem specific input signals.

Connected between the input of each amplifier and a reference ground is an integrating circuit consisting of the parallel combination of a resistor R and a capacitor C. The values of R and C are chosen such that the time constant of each integrating circuit is appropriate for taking the analog sum of the weighted output signals and external signals applied to the input lines $l_1$-$l_N$ extending from the inputs of amplifiers $A_1$-$A_N$, respectively.

Where the diagonal elements, $W_{ii}$, of the weighting matrix W are all zero and the amplifier $A_1$-$A_N$ each have a high gain (i.e., a sharp sigmoid transfer function), the stable states of the neural network 100 are the local minima of the quantity.

$$E = -\tfrac{1}{2}\sum_{i=1}^{N}\sum_{j=1}^{N} W_{ij}x_ix_j - \sum_{i=1}^{N} x_iI_i = -\tfrac{1}{2}x^TWx - I^Tx. \quad (2)$$

The use of neural networks of the type illustrated in FIG. 1 for standard A/D conversion is described in a paper entitled "Sample 'Neural' Optimization Networks: an A/D Converter, Signal Decision Circuit, and a Linear Programing Circuit" by David W. Tank and John J. Hopfield, publisehd in the IEEE Transactions on Circuits and Systems, VOL. CAS-33, No. 5, May 1986, pp. 533-541. For the standard A/D conversion problem, equation (2) takes the form of $$E = -\frac{1}{2} \sum_{i=1}^{N} \sum_{j=1}^{N} (-2^{i+j})x_i x_j - \sum_{i=1}^{N} (-2^{(2i-1)} + 2^i u_n)x_i, \quad (3)$$

where $u_n$ is a sample of an analog signal being digitized. According to equation (3), each weighting factor $W_{ij}$ has the value of $-2^{(i+j)}$ and each external signal $T_i$ has the value $-2^{(2i-1)} + 2^i u_n$.

An example of a 4-bit standard A/D converter implemented with a neural network having a resistive weighting circuit in accordance with the aforementioned D. W. Tank et. al paper is shown in FIG. 3. A continuous-time analog signal u(t) is provided to a sample-and-hold circuit 301, which samples u(t) at a rate determined by a sampling clock signal $\alpha_s$ to provide analog signal samples $u_n$. The analog signal samples $u_n$ are provided one at a time to the resistive weighting circuit 302 of a neural network 300 having four amplifiers $A_0$–$A_3$. A negative one-volt constant signal is also applied to the resistive weighting circuit 302. The relative values of the resistance of the weighting circuit 302 are determined according to the foregoing relationships for the weighting factors $W_{ij}$ and external signals $I_i$.

The bit values $b_0, \ldots b_3$, of the digital code representing each analog signal sample $u_n$ are provided at the normal output terminals of the amplifiers $A_0$–$A_3$, respectively.

Analog-to-digital converters of the type illustrated in FIG. 3 have the drawback in that the circuit 300 does not always stabilize to an acceptably accurate digital representation of the analog signal sample $u_n$. Furthermore, since such circuits provide for standard A/D conversion, in which each analog signal sample is mapped to its closest reconstruction level, the quantized digital signals provided thereby are not optimal for use in certain applications, such as those involving human sensory perception.

SUMMARY OF THE INVENTION

The foregoing shortcoming of the prior art are overcome, and the aforementioned need is substantially satisfied by the present invention, which, in one aspect, is a 1-bit nonstandard A/D converter for converting a sampled analog signal u having N samples $u_1, \ldots, u_N$ each with values between a "0" and a "1" logic level, a digital signal x having N corresponding 1-bit binary values $x_1, \ldots, x_N$, such that a distortion measure $d = (Au - Bx)^T(Au - Bx)$ is minimized, where u and x are N-dimensional vectors, A and B are N×N matrices, and N is an integer greater than 1. The 1-bit A/D converter has N nonlinear amplifiers $A_1, \ldots, A_N$, each having an output terminal supplying an output signal and an input circuit operatively coupled to receive the output signals supplied by other amplifiers and one or more of the samples of the signal u. The input circuit of each amplifier derives the weighted sum of the signals it receives by applying a respective weighting factor to each such signal and summing the weighted signals and a respective constant signal before providing the weight sum signal to the amplifier. For any two of the amplifiers $A_i$ and $A_j$, where i and j are independent integers having values $i = 1, 2, \ldots, N$ and $j = 1, 2, \ldots, N$, the weighting factor $W_{ij}$ applied to the input circuit of $A_i$ by the output signal supplied by $A_j$ is the element of the $i^{th}$ row and $j^{th}$ column of a matrix $-B^TB$, and the weighting factor $K_{ij}$ applied by the input circuit of $A_i$ to an analog signal sample $u_j$ is the element of the $i^{th}$ row and $j^{th}$ column of a matrix $B^T$. The value of the constant signal $I_{ci}$ forming part of the weighted sum signal provided to $A_i$ is the element of the $i^{th}$ row and $i^{th}$ column of the matrix $-B^TB$ divided by two. After the circuit has stabilized, the output signals supplied by the amplifiers $A_1, \ldots, A_N$ are the binary values $x_1, \ldots, x_N$ of the digital signal x.

In the preferred embodiment, the transfer function of each amplifier of the 1-bit A/D converter has a sigmoid shape. The combined input circuits of the amplifiers may be implemented with a resistor array, which includes a resistor $R_{ij}$ corresponding to each nonzero weighting factor $W_{ij}$ and having a value proportional to $1/|W_{ij}|$. Each resistor $R_{ij}$ connects the output terminal of amplifier $A_j$ to the input of amplifier $A_i$. The resistor array of the input circuits further includes a resistor $R_{Iij}$ corresponding to each nonzero weighting factor $K_{ij}$ and having a value proportional to $1/|K_{ij}|$. Each resistor $R_{Iij}$ connects an analog signal sample $u_j$ to the input of a respective amplifier $A_i$. The resistor array of the input circuits further includes a resistor $R_{ci}$ corresponding to each constant signal $I_{ci}$ and having a value proportional to $V_R/I_{ci}$, where $V_R$ is a reference voltage. Each resistor $R_{ci}$ connects the reference voltage $V_R$ to the input of a respective amplifier $A_i$.

The input circuits of the amplifiers may also be implemented with switched capacitor circuits. In such an implementation a capacitor C is operatively connected between the output terminal and the input of each amplifier. The switched capacitor circuits include a capacitor $C_{ij}$ corresponding to each nonzero weighting factor $W_{ij}$ and having a value proportional to $|W_{ij}|C$. The capacitor $C_{ij}$ is for storing samples of the output signal supplied by an amplifier $A_j$, which are provided to the input of another amplifier $A_i$. The switched capacitor circuits also include a capacitor $C_{Iij}$ corresponding to each nonzero weighting factor $K_{ij}$ and having a value proportional to $|K_{ij}|C$. The capacitor $C_{Iij}$ is for storing samples an analog signal sample $u_j$, which are provided to the input of an amplifier $A_i$. The switched capacitor circuits further include a capacitor $C_{ci}$ corresponding to each constant signal $I_{ci}$ and having a value proportional to $|I_{ci}|C$. The capacitor $C_{ci}$ is for storing samples a constant signal, which are provided to the input of an amplifier $A_i$.

Another aspect of the invention is a multiple-bit nonstandard A/D converter for converting a sampled analog signal u having N samples $u_1, \ldots, u_N$, into a digital signal x having N corresponding m-bit binary values $x_1, \ldots, x_N$, each equal to one of $2^m$ predefined quantization levels, such that a distortion measure $d = [A(u-Q)-B(x'-Q)]^T[A(u-Q)-B(x'-Q)]$ is minimized, where N and m are integers greater than 1, u and x' are N-dimensional vectors consisting of the N samples $u_1, \ldots, u_N$ and N analog representations of the binary valves $x_1, \ldots, x_N$, respectively, and A and B are N×N matrices. Q is an N-dimensional vector having values $Q_1, \ldots, Q_N$ each equal to one of the quantization levels closest to but smaller than a corresponding element of u.

The multiple-bit A/D converter includes a truncating quantizer connected to receive the analog signal samples $u_1, \ldots, u_N$. The truncating quantizer provides for each received analog signal sample $u_n$ an analog value $Q_n$ equal to one of the quantization levels which is closest to and smaller than the received analog signal sample. In addition, the truncating quantizer provides the m-bit binary representation $Q_{bn}$ of each analog value $Q_n$.

An analog subtraction circuit forming part of the multiple-bit A/D converter receives each analog signal samples $u_n$ and its corresponding analog quantization level value $Q_n$, and supplies a respective difference value $u_n$ between $u_n$ and $Q_n$.

The multiple-bit A/D converter further includes N nonlinear amplifiers $A_1, \ldots, A_N$ each having an output terminal supplying an output signal, and an input circuit operatively coupled to receive the output signals supplied by other amplifiers and one or more of the difference values supplied by the analog subtraction circuit. The input circuit of each amplifier derives the weighted sum of the signals it receives by applying respective weighting factors to the received signals and taking the sum of the weighted signals and a respective constant signal before providing the weighted sum signal to the input of the amplifier. For any two amplifiers $A_i$ and $A_j$ the weighting factor $W_{ij}$ applied by the input circuit of $A_i$ to the output signal supplied by $A_j$ is the element of the $i^{th}$ row and $j^{th}$ column is a matrix $-B^TB$, where i and j are independnet integers having values $i=1, 2, \ldots, N$ and $j=1, 2, \ldots, N$. The weighting factor $K_{ij}$ applied by the input circuit of $A_i$ to an analog signal sample $u_j$ received thereby is the element of the $i^{th}$ row and $j^{th}$ column of a matrix $B^T$, and the constant signal $I_{ci}$ included in the sum signal provided to the input of $A_i$ is the element of the $i^{th}$ row and $i^{th}$ column of the matrix $-B^TB$. The output signals of the amplifiers $A_1, \ldots, A_N$, stabilize to 1-bit binary values $\hat{x}_1, \ldots, \hat{x}_N$ corresponding to the difference values $\hat{u}_1, \ldots, \hat{u}_N$.

Also included in the multiple-bit A/D converter is a digital adder coupled to receive the stabilized output signals $\hat{x}_1, \ldots, \hat{x}_N$ supplied by the N amplifiers and the binary representations $Q_{b1}, \ldots, Q_{bN}$ of the quantization levels corresponding to the analog signal samples $u_1, \ldots, u_N$, as provided by the truncating quantizer. The digital adder derives the sum of the stabilized output signal $\hat{x}_i$ supplied by each amplifier $A_i$ and the binary representation $Q_{bi}$ of the quantization level corresponding to analog signal sample $u_i$ to provide a corresponding m-bit binary value $x_i$ of the signal x.

As for the 1-bit A/D converter, the input circuits of the amplifiers of the multiple-bit A/D converter may be implemented with switched-capacitor circuits in the manner discussed above.

Still further aspects of the invention are a method for 1-bit nonstandard A/D conversion and a method for multiple-bit nonstandard A/D conversion as carried out, for example, by the foregoing 1-bit and multiple-bit converters.

BRIEF DESCRIPTION OF THE DRAWING

The invention will be better understood from the following detailed description of exemplary embodiments thereof taken in conjunction with the accompanying drawing, in which.

Throughout the figures of the drawing the same reference characters and numerals are used to denote like components, portions, elements, and features of the disclosed apparatus and method.

DETAILED DESCRIPTION

Figure 4A:
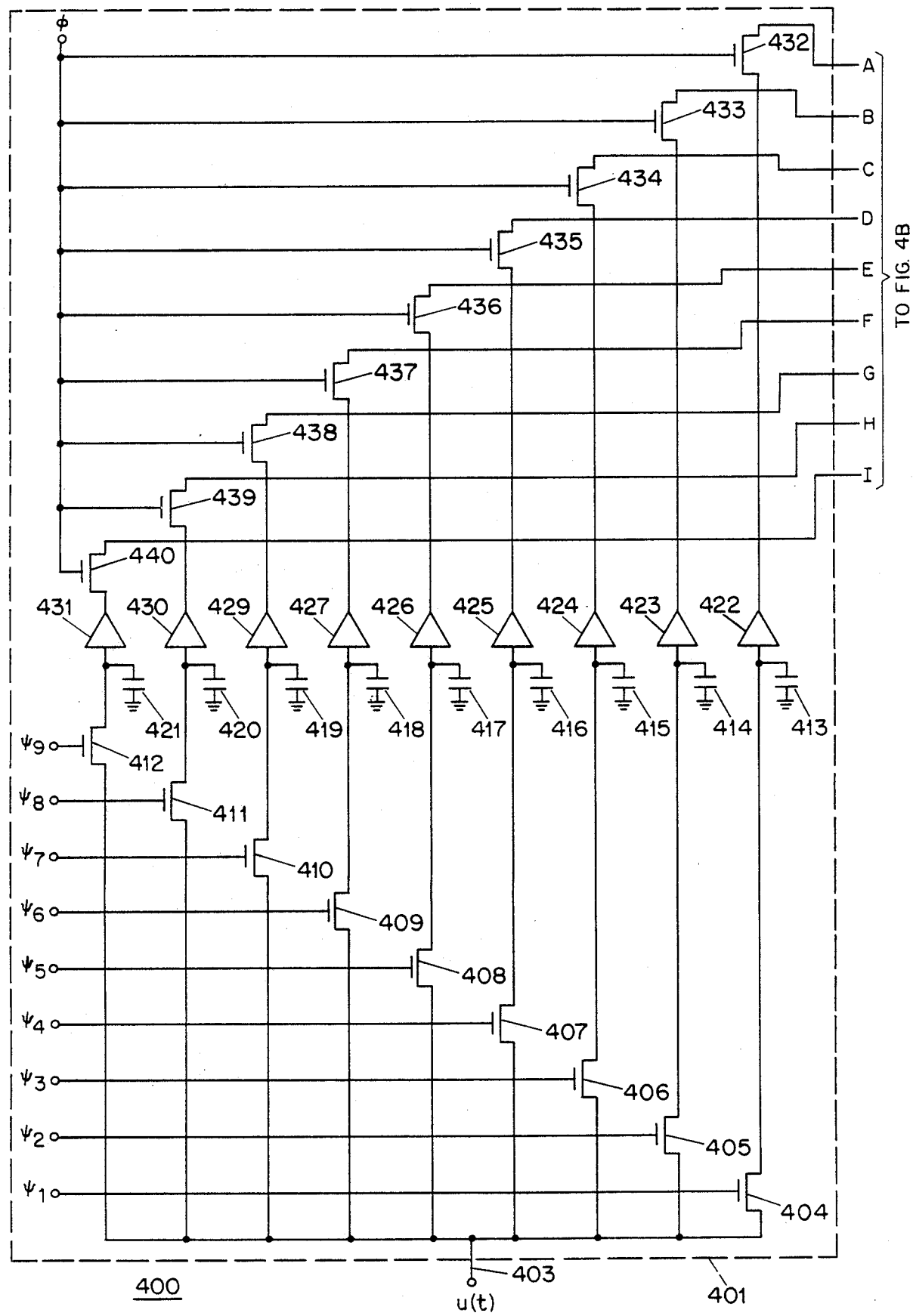
FIGS. 4a and 4b show schematic diagrams of a nine sample nonstandard 1-bit A/D converter circuit implemented with a neural network with a resistive weighting circuit in accordance with an exemplary embodiment of the invention.
Figure 4B:
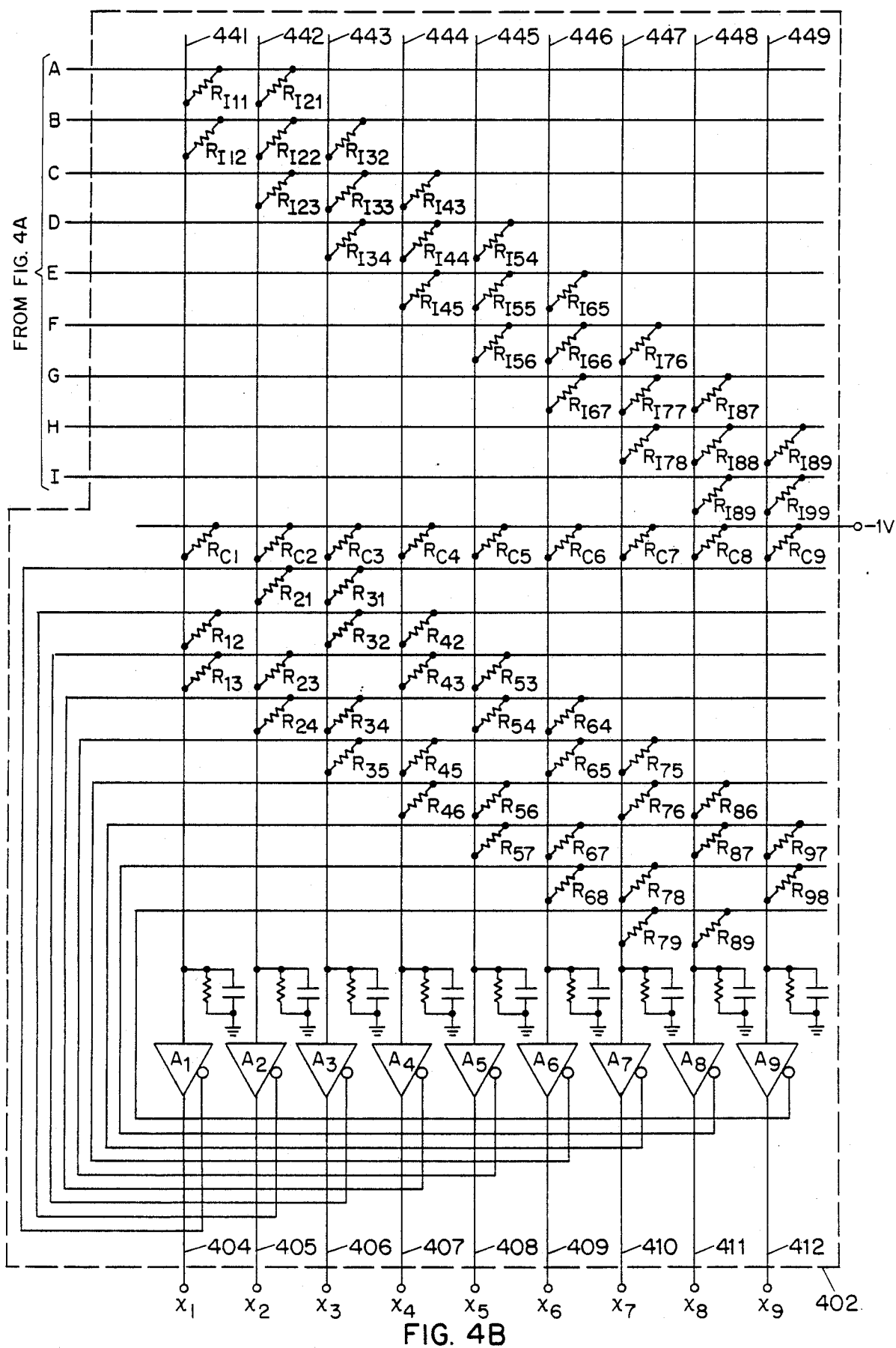

Referring now to FIG. 4, there is shown a schematic diagram of a nonstandard 1-bit A/D converter circuit 400, according to an exemplary embodiment of the invention. The circuit 400 converts a block of nine samples $u_1, \ldots, u_9$ of a continuous-time analog signal u(t) received at an input terminal 403 into nine corresponding 1-bit binary representations $x_1, \ldots, x_9$ provided at output terminals 404–412. The samples of the signal u(t) are each quantized by the circuit 400 to one of two levels (i.e., bilevel quantization) in such a manner so as to minimize a distortion measure of the form $$d(u,x) = (Au-Bx)^T(Au-Bx) \quad (4)$$

where u is a vector consisting of the nine samples of the signal u(t), x is a vector consisting of the nine corresponding 1-bit binary values, A and B are $9 \times 9$ matrices representative of the input and output response characteristics of a system in which the converter circuit 400 is used.

The amplitude of the analog signal u(t) is in the range between the "0" logic level and the "1" logic level of the binary values $x_1, \ldots, x_9$. Signals having amplitudes which potentially deviate from that range must first be level shifted and/or attenuated, using well known circuit techniques, before being applied to the input terminal 403.

Bi-level quantization is used in various applications such as digital image halftoning and sigma-delta modulation of speech. In digital image halftoning an image is formed with uniform-size picture points having either maximum or minimum intensity (e.g., white or black), so as to create the illusion of a continuous tone image. Using standard A/D conversion for digital image halftoning, where the quantization threshold for the picture points is chosen to be always at the midpoint of the intensity values of corresponding pixels, often produces unsatisfactory results, such as the absence of gray level rendition and the introduction of artificial contours. Much improved results may be obtained by quantizing the pixel intensity values to minimize an appropriate distortion measure of the form of equation (4), as will be further explained hereinbelow. Using such nonstandard quantization can lead to an image rendition in which the proportion of picture points of minimum intensity in a neighborhood of pixels approximates the local darkness of the image.

In sigma-delta modulation of speech, audio speech signals are sampled at a rate greater than the Nyquist frequency (i.e., oversampled), and the samples are first subjected to 1-bit A/D conversion based on a recursive scheme. The 1-bit digital signals produced by the 1-bit A/D conversion are then passed through an appropriate digital filter and subsampled to obtain multiple-bit digital codes representative of the audio speech signals. The A/D conversion used in sigma-delta modulation has been found to introduce distortion in the speech reproduced from the digital codes. Greater fidelity in the reproduced speech may be achieved by nonstandard A/D conversion based on the minimization of an appropriate distortion measure of the form of equation (4).

In FIG. 4 the bilevel converter circuit 400 includes a parallel sample-and-hold circuit 401, which takes blocks of nine samples $u_1, \ldots, u_9$ of the analog signal $u(t)$ and applies an entire block of nine samples in parallel to a neural network 402. The sample-and-hold circuit 401 includes nine MOS input transistors 404-412 which act as switches connecting the analog signal $u(t)$ to the input of a respective one of nine unity-gain amplifiers 422-431. Each of the amplifiers 422-431 has a capacitor 413-421 connected between its input and reference ground.

Nine sampling signals $\psi_1-\psi_9$ are applied to respective gates of the input transistors 404-412 to sequentially drive each one to a conducting state for a predetermined sampling interval. When an input transistor is driven to a conducting state for a respective sampling interval, the average amplitude voltage of the analog signal $u(t)$ during that interval is applied across the capacitor connected to the transistor and is stored therein after the transistor returns to a nonconducting state. Each one of the amplifiers 422-431 receives the voltage stored in the capacitor connected to its input and provides that voltage at its output. Therefore, after all of the input transistors 404-412 have been driven to a conducting state during respective sampling intervals, the outputs of the amplifiers 422-431 provide nine samples of the analog signal $u(t)$.

The parallel sample-and-hold circuit 401 further includes nine MOS output transistors 432-440, each serving as a switch for connecting the output of one of the amplifiers 422-431 to one of the input lines 441-449 of the neural network 402. The gates of the output transistors each receive the same output clock signal $\phi$ for simultaneously driving the transistors 432-440 to a conducting state to provide the nine analog signal samples $u_1, \ldots, u_9$ supplied by the outputs of the amplifiers 422-431 to the input lines 441-449 of the neural network 402.

Figure 5:
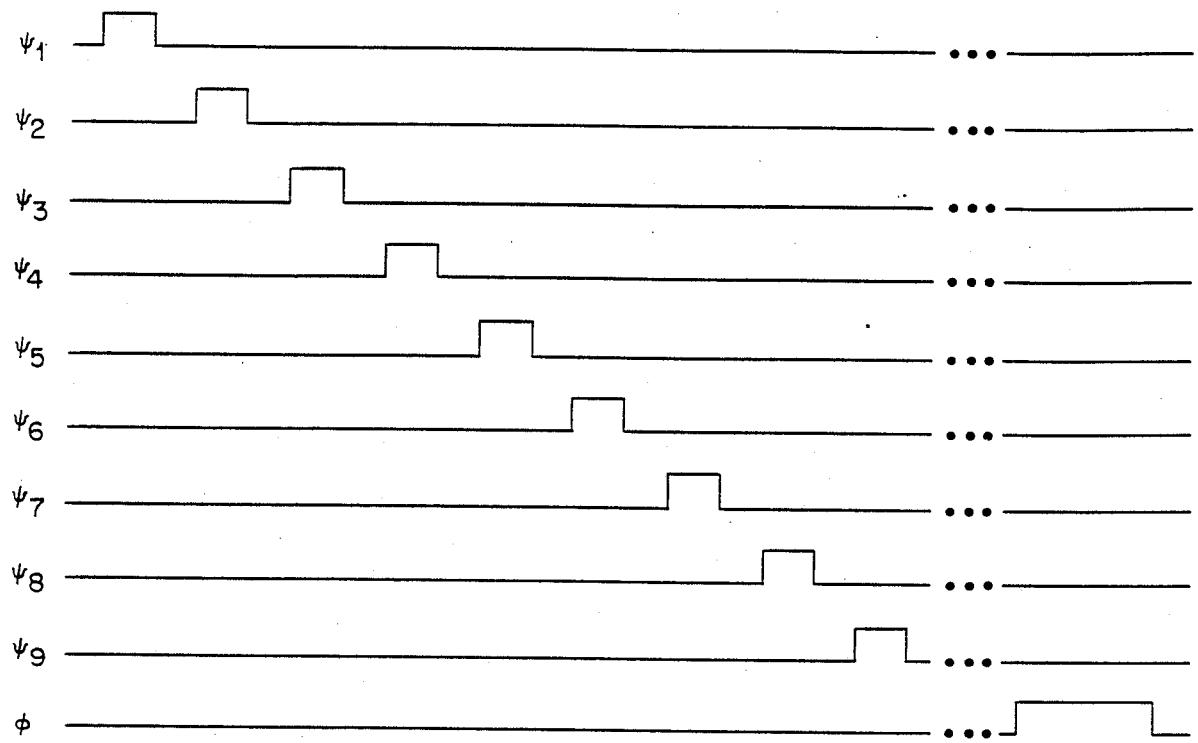
FIG. 5 illustrates the waveforms of the nine sampling signals $\psi_1-\psi_9$ and the output clock signal $\phi$ for the parallel sample-and-hold circuit 401 used in the 1-bit A/D converter circuit of FIG. 4.

The waveforms for the sampling signals $\psi_1-\psi_9$ and the output clock signal $\phi$ are shown in FIG. 5. For the example illustrated by FIG. 4, each of the MOS transistors is of the n-channel type which is driven to a conducting state by a positive going voltage pulse. The pulse width of each of the sampling signal $\psi_1-\psi_9$ represent the length of the sampling interval. The width of the pulse of the output clock signal $\phi$ is set to be sufficiently long to allow the neural network 402 to reach a stable state.

Figure 2:
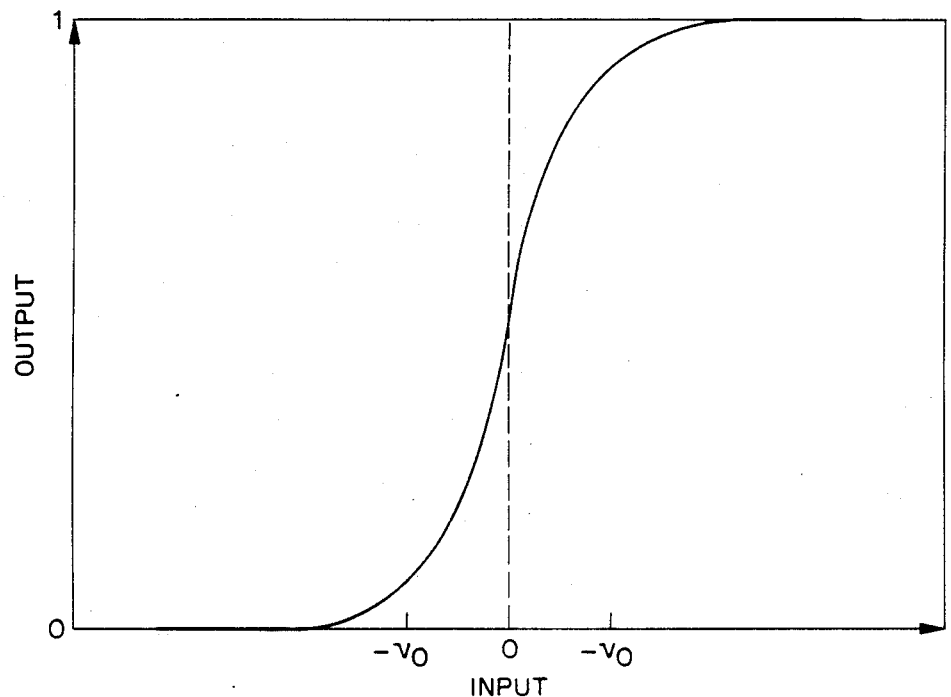
FIG. 2 illustrates the sigmoid transfer function of each amplifier of the neural network of FIG. 1.
Figure 3:
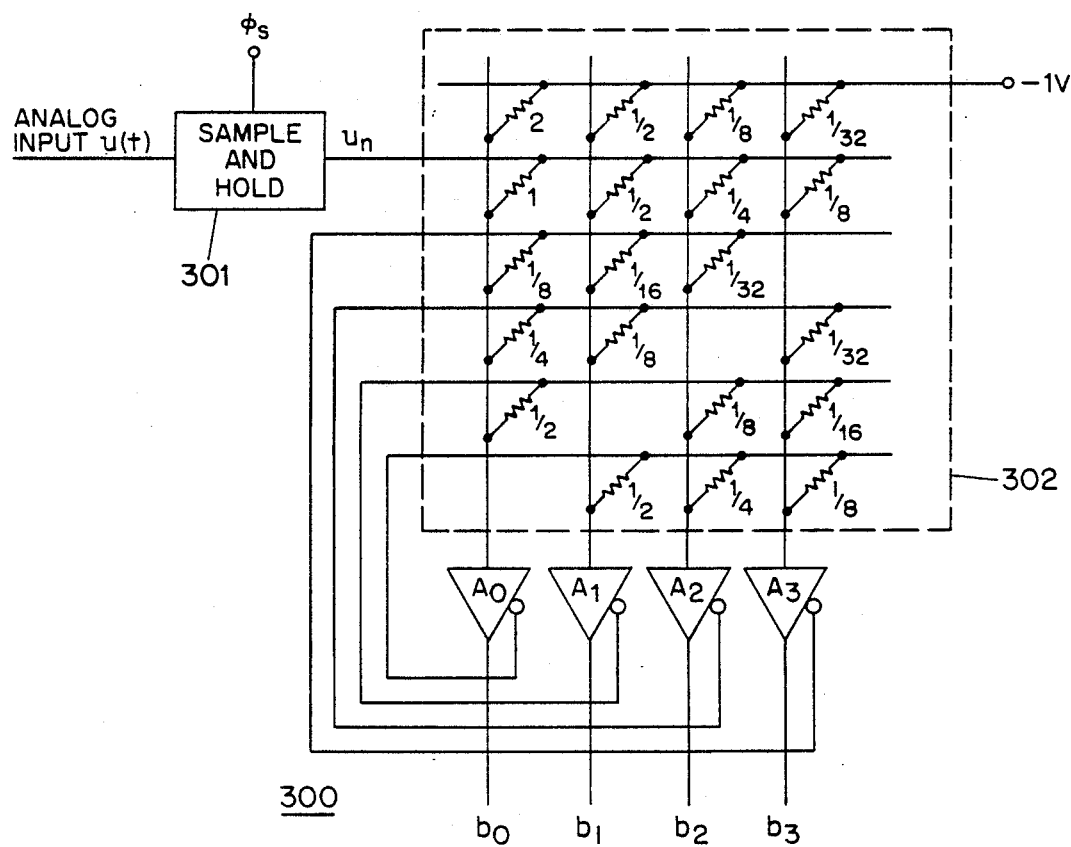
FIG. 3 is a schematic diagram of a known 4-bit standard A/D converter circuit implemented with a neural network with a resistive weighting circuit.

The neural network 402 has nine nonlinear amplifiers $A_1-A_9$, each providing a normal and an inverted output signal, and a resistive weighting circuit for forming the input signals provided to the amplifiers $A_1-A_9$. The input signal for each amplifier is formed by taking the weighted sum of the output signals of certain other amplifiers, of certain ones of the analog signal samples and a respective constant signal. Each of the amplifiers $A_1-A_9$ has a sigmoid shape transfer function as shown in FIG. 2.

Figure 1:
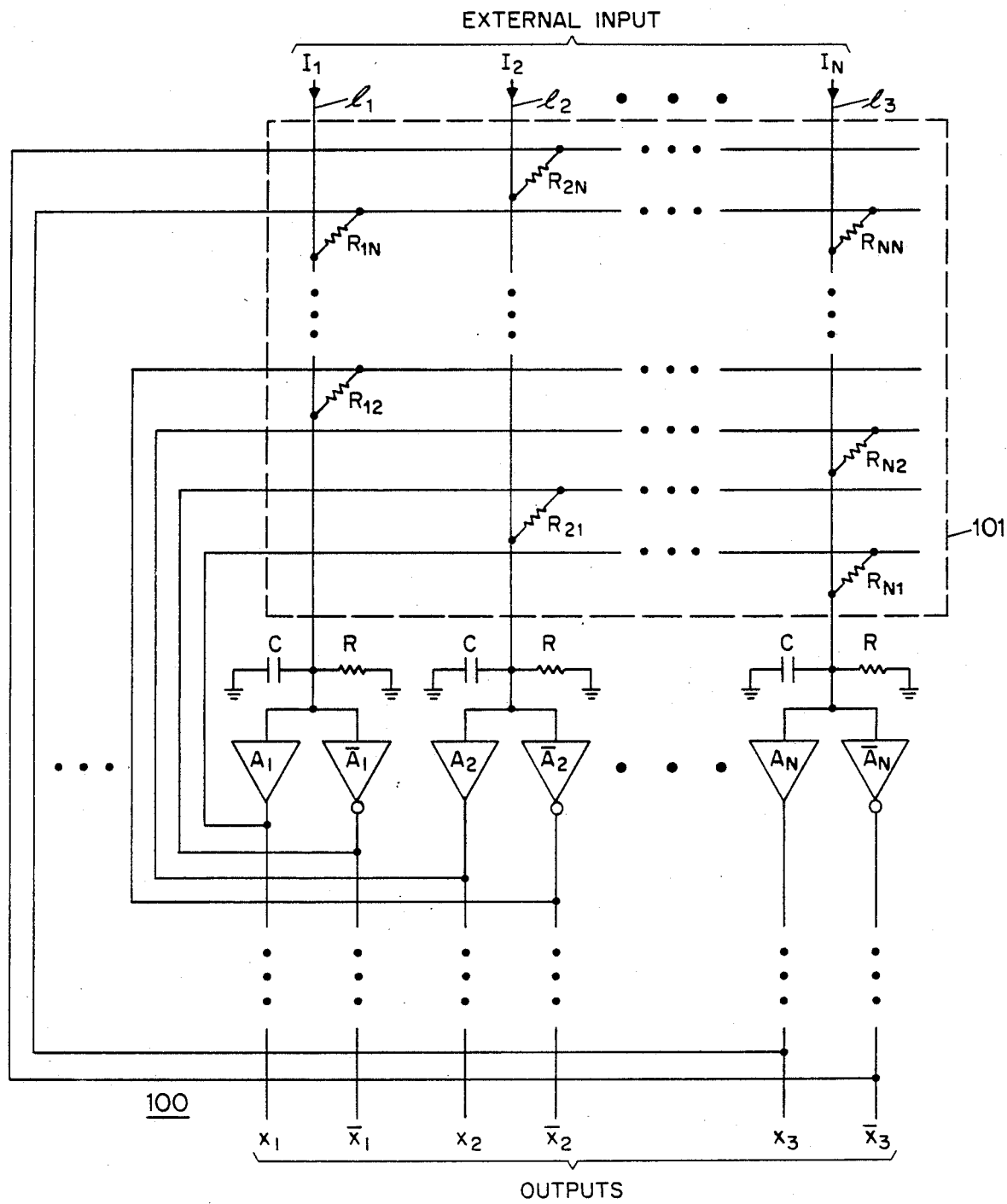
FIG. 1 is a schematic diagram of a known neural network having a resistive weighting circuit.

As explained hereinabove in connection with the neural network of FIG. 1, the weighted sum of signals provided to each amplifier is derived by applying a respective weighting factor to each signal forming part of the weighted sum and then summing the weighted signals. For a neural network having a resistive weighting circuit, the weighting factors are determined by the values of resistors connecting signals forming part of the weighted sum to the input lines extending from the amplifiers, and the summing of the weighted signals is provided by a parallel RC circuit at the input of each amplifier.

The weighting circuit of the neural network 402 is designed such that the nine samples $u_1, \ldots, u_9$ of the analog signal $u(t)$ provided by the parallel sample-and-hold circuit 401 are converted to nine corresponding 1-bit binary values $x_1, \ldots, x_9$ provided at the normal output terminals 404-412 of the amplifiers $A_1-A_9$. Each one of the nine samples of the analog signal $u(t)$ is quantized in a nonstandard manner, such that a distortion measure of the form of equation (4) is at a global or local minimum. In the present example u is a 9-dimensional vector consisting of the nine samples $u_1, \ldots, u_9$, of the analog signal $u(t)$ received by the neural network 402, x is a 9-dimensional vector consisting of the nine 1-bit binary values $x_1, \ldots, x_9$, A and B are $9 \times 9$ matrices.

For simplicity of the illustrative example, the A matrix, which relates to input response characteristics, is taken to be a unit matrix. The matrix B, which relates to output response characteristics, is taken to represent a weighted average of each binary value $x_i$ with its nearest neighbor binary values $x_{i-1}$ and $x_{i-1}$, such that if $\bar{x}_i = Bx$, then $$\bar{x}_i = \tfrac{1}{4}x_{i-1} + \tfrac{1}{2}x_i + \tfrac{1}{4}x_{i-1}. \tag{5}$$

Therefore, the B matrix may be expressed as $$B = \begin{bmatrix} 0.75 & 0.25 & 0 & 0 & 0 & 0 & 0 & 0 & 0 \\ 0.25 & 0.50 & 0.25 & 0 & 0 & 0 & 0 & 0 & 0 \\ 0 & 0.25 & 0.50 & 0.25 & 0 & 0 & 0 & 0 & 0 \\ 0 & 0 & 0.25 & 0.50 & 0.25 & 0 & 0 & 0 & 0 \\ 0 & 0 & 0 & 0.25 & 0.50 & 0.25 & 0 & 0 & 0 \\ 0 & 0 & 0 & 0 & 0.25 & 0.50 & 0.25 & 0 & 0 \\ 0 & 0 & 0 & 0 & 0 & 0.25 & 0.50 & 0.25 & 0 \\ 0 & 0 & 0 & 0 & 0 & 0 & 0.25 & 0.50 & 0.25 \\ 0 & 0 & 0 & 0 & 0 & 0 & 0 & 0.25 & 0.75 \end{bmatrix} \quad (6)$$

The first and last elements of the diagonal of the B matrix of equation (6) are normalized to 0.75 to compensate for the fact that the first and last binary values, $x_1$ and $x_9$, each has only one nearest neighbor value.

The B matrix of equation (6) represents a rough approximation of the sensitivity of the human visual system to various spatial frequencies. Other B matrices representing more refined approximations of the response of other systems for which the distortion measure of equation (4) is appropriate will be known to those skilled in the art.

Since the A matrix in our example is a unit matrix, the distortion measure to be minimized may be expressed as $$d(u,x) = (u-Bx)^T(u-Bx) = u^Tu + x^TB^TBx - 2u^TBx. \quad (7)$$

where the susperscript T denotes the transpose of a matrix or vector. Since the term $u^Tu$ in equation (7) is a constant, minimization of $d(u,x)$ will be equivalent to the minimization of a quantity E which may be expressed as $$E = -\tfrac{1}{2}x^T(-B^TB)x - (B^Tu)^Tx. \quad (8)$$

Equation (8) has the same form as equation (2), if a weighting factor matrix W is defined as $W = -B^TB$ and an input signal vector I is defined as $I = B^Tu$. As explained above in connection with the circuit of FIG. 1, if the diagonal elements of the weighting factor matrix W are zero and if the gains of the amplifiers are high (i.e., the width of the sigmoid transfer function is narrow), the stable states of a circuit of the type illustrated in FIG. 1 are local minima of equation (2). Therefore, if the diagonal elements of the matrix $-B^TB$ are each cancelled to zero and the amplifiers $A_1$–$A_9$ each have a sharp sigmoid transfer function, a neural network may be constructed so as to have stable states which are local minima of equation (8). The output signals $x_1, \ldots, x_9$ of the amplifiers $A_1$–$A_9$ after the network has stabilized are digital representations of the analog signal samples $u_1, \ldots, u_9$ quantized to predefined reconstruction levels, which are the "0" and "1" logic levels of the amplifiers $A_1$–$A_9$, in such a manner so as to bring the distortion measure of equation (7) to a global or local minimum.

From the exemplary B matrix of equation (5), the weighting factor matrix W may be derived as $W = -B^TB =$ $$\begin{bmatrix} -0.625 & -0.312 & -0.063 & 0 & 0 & 0 & 0 & 0 & 0 \\ -0.312 & -0.375 & -0.025 & -0.063 & 0 & 0 & 0 & 0 & 0 \\ -0.063 & -0.25 & -0.375 & -0.25 & -0.063 & 0 & 0 & 0 & 0 \\ 0 & -0.063 & -0.25 & -0.375 & -0.25 & -0.063 & 0 & 0 & 0 \\ 0 & 0 & -0.063 & -0.25 & -0.375 & -0.25 & -0.063 & 0 & 0 \\ 0 & 0 & 0 & -0.063 & -0.25 & -0.375 & -0.25 & -0.063 & 0 \\ 0 & 0 & 0 & 0 & -0.063 & -0.25 & -0.375 & -0.25 & 0 \\ 0 & 0 & 0 & 0 & 0 & -0.063 & -0.25 & -0.375 & -0.312 \\ 0 & 0 & 0 & 0 & 0 & 0 & -0.063 & -0.312 & -0.625 \end{bmatrix} \quad (9)$$

The diagonal elements of the weighting factor matrix W of equation (9) can all be made equal to zero by expressing equation (8) as $$E = -\tfrac{1}{2}\sum_{i=1}^{9}\sum_{j=1}^{9} W_{ij}x_ix_j - \sum_{i=1}^{9} I_ix_i. \quad (10)$$

and adding to equation (10) a term of the form $$-\tfrac{1}{2}\sum_{i=1}^{9} W_{ii}x_i(x_i - 1). \quad (11)$$

Since the term (11) has minimal value when $x_i = 1$ or $x_i = 0$ for each i, it provides for cancellation of the diagonal elements $W_{ii}$ of the weighting factor matrix W without changing the local minima of equation (8) for binary values of $x_i$.

After the addition of the term (11) and substituting $$I_i = \sum_{j=1}^{9} B_{ij}u_j, \quad (12)$$

where $B_{ij}$ is the element of the $i^{th}$ row and $j^{th}$ column of the matrix B, equation (10) becomes $$E = -\tfrac{1}{2}\sum_{\substack{i=1 \\ i \neq j}}^{9}\sum_{j=1}^{9} W_{ij}x_ix_j - \sum_{i=1}^{9}\sum_{j=1}^{9} (B_{ij}u_j - \tfrac{1}{2}W_{ii})x_i. \quad (13)$$

From equation (13) the weighting factors and constant signals used for forming the weighted sum input signal for each amplifier $A_i$ ($i = 1, 2, \ldots, 9$) of the circuit 402 may be obtained. The weighting factor applied to the output signal of each other amplifier $A_j$ ($j = 1, 2, \ldots, N$) in forming the weighted sum signal for another amplifier $A_i$ is $W_{ij}$. The weighting factor applied to each analog signal sample $u_j$ in forming the weighted sum signal for an amplifier $A_i$ is $B_{ij}$, and the constant signal forming part of the weighted sum signal for amplifier $A_i$ is $W_{ii}/2$. The value of $W_{ij}$ is the element of the $i^{th}$ row and $j^{th}$ column of the W matrix of equation (9). The value of $W_{ii}$ is the element of the $i^{th}$ row and $i^{th}$ column of the W matrix of equation (9). The value of $B_{ij}$ is the element of the $i^{th}$ row and $j^{th}$ column of the B matrix of equation (6).

In the resistive weighting circuit of the exemplary neural network 402, the values of the various resistors used therein are related to the weighting factors $W_{ij}$, $W_{ii}$ and $B_{ij}$ in the following manner: each resistor $R_{ij}$ connecting the input line extending from an amplifier $A_i$ to the output terminal of another amplifier $A_j$ is proportional to $1/|W_{ij}|$; each resistor $R_{ci}$ connecting a negative one volt source to the input line extending from an amplifier $A_i$ is proportional to $2/|W_{ii}|$; and each resistor $R_{Iij}$ connecting the input line extending from an amplifier $A_i$ to an analog signal sample $u_j$ is proportional $1/|B_{ij}|$. It is noted that the constant signals forming part of the weighted sum signal for each amplifier $A_i$ is derived by connecting a resistor $R_{ci}$ between an appropriate reference source and the input line extending from $A_i$. Furthermore, since the weighting factors $W_{ij}$ for the output signals of the amplifiers $A_1$–$A_9$ are all negative, only the inverting output terminals of the amplifiers are used for connections to the input lines 441-449 through respective resistors $R_{ij}$.

The absolute values of the resistors used in the exemplary neural network 402 will depend upon the output voltage range of the amplifiers $A_1$-$A_9$, the voltage range of the analog signal samples $u_1, \ldots, u_9$, the reference voltage used to derive the constant signals and the specification for power dissipation of the circuit. If the output voltage range of the amplifiers $A_1$-$A_9$ is 0 and $V_{DD}$, the voltage range of the analog signal samples $u_1, \ldots, u_9$ is 0 and $V_{max}$ and the reference voltage for deriving the constant input signals is $-V_R$, and assuming reasonable power dissipation for such voltage ranges and reference voltage, the value of each resistor $R_{ij}$ is $V_{DD}/|W_{ij}|$, the value of each resistor $R_{Iij}$ is $V_H/|B_{ij}|$ and the value of each resistor $R_{ci}$ is $2V_R/|W_{ii}|$.

For illustrative purposes it is assumed that the block of nine samples provided by the parallel sample-and-hold circuit 401 to the neural network 402 represents the intensity values of nine adjacent pixels in a portion of an image having a constant gray scale of 35% of maximum intensity. Accordingly, the sampled analog signal u may be expressed as $$u = \begin{bmatrix} 0.35 \\ 0.35 \\ 0.35 \\ 0.35 \\ 0.35 \\ 0.35 \\ 0.35 \\ 0.35 \\ 0.35 \end{bmatrix}. \quad (14)$$

With the analog signal samples of equation (14) applied to the input lines 441-449, the neural network 402 stabilizes to one of the local minima of equation (7). One such local minimum provides the following digital signal x at the normal outputs 404-412 of the amplifiers $A_1$-$A_9$:

$$x = \begin{bmatrix} 0 \\ 1 \\ 0 \\ 0 \\ 1 \\ 0 \\ 0 \\ 1 \\ 0 \end{bmatrix}. \quad (15)$$

To compute the distortion measure of equation (7), the digital signal x of equation (15) is first multiplied by the B matrix of equation (6) to obtain $$Bx = \begin{bmatrix} 0.25 \\ 0.50 \\ 0.25 \\ 0.25 \\ 0.50 \\ 0.25 \\ 0.25 \\ 0.50 \\ 0.25 \end{bmatrix}. \quad (16)$$

Then using the sampled analog signal u of equation (13), the distortion d(u,x) is computed as $$d(u,x) = (u - Bx)^T(u - Bx) = (0.10)^2 + (0.15)^2 + \quad (17)$$

$$(0.10)^2 + (0.10)^2 + (0.15)^2 + (0.10)^2 + (0.10)^2 + (0.15)^2 +$$

$$(0.10)^2 = 0.1275.$$

The distortion value of equation (17) is closed to if not equal to the minimum possible distortion.

The digital signal x of equation (15) may be considered as representing a group of nine adjacent picture elements in a region of a digital halftoned image having a uniform intensity value of 35% of maximum intensity.

Because the 1-bit A/D converter in accordance with the invention converts a continuous-amplitude signal u(t) to a quantized digital signal x in blocks of N samples, where N is an integer greater than 1, an analog signal reconstructed from the digital signals provided by the A/D converter may exhibit distortion at the block boundaries. This "blocking effect" may be reduced by overlapping the digital signals representing neighboring blocks of samples by a predetermined number of digital values.

For example, in the exemplary neural network 402 of FIG. 4, the output signals $x_1$, $x_2$ and $x_3$ o the first three amplifiers $A_1$, $A_2$ and $A_3$ for a given block of nine samples received by the network 402 may be fixed by appropriate conventional means to be respectively equal to the output signals $x_7$, $x_8$ and $x_9$ of the last three amplifiers $A_7$, $A_8$ and $A_9$ for the previous block of nine samples received by the network 402.

Figure 6:
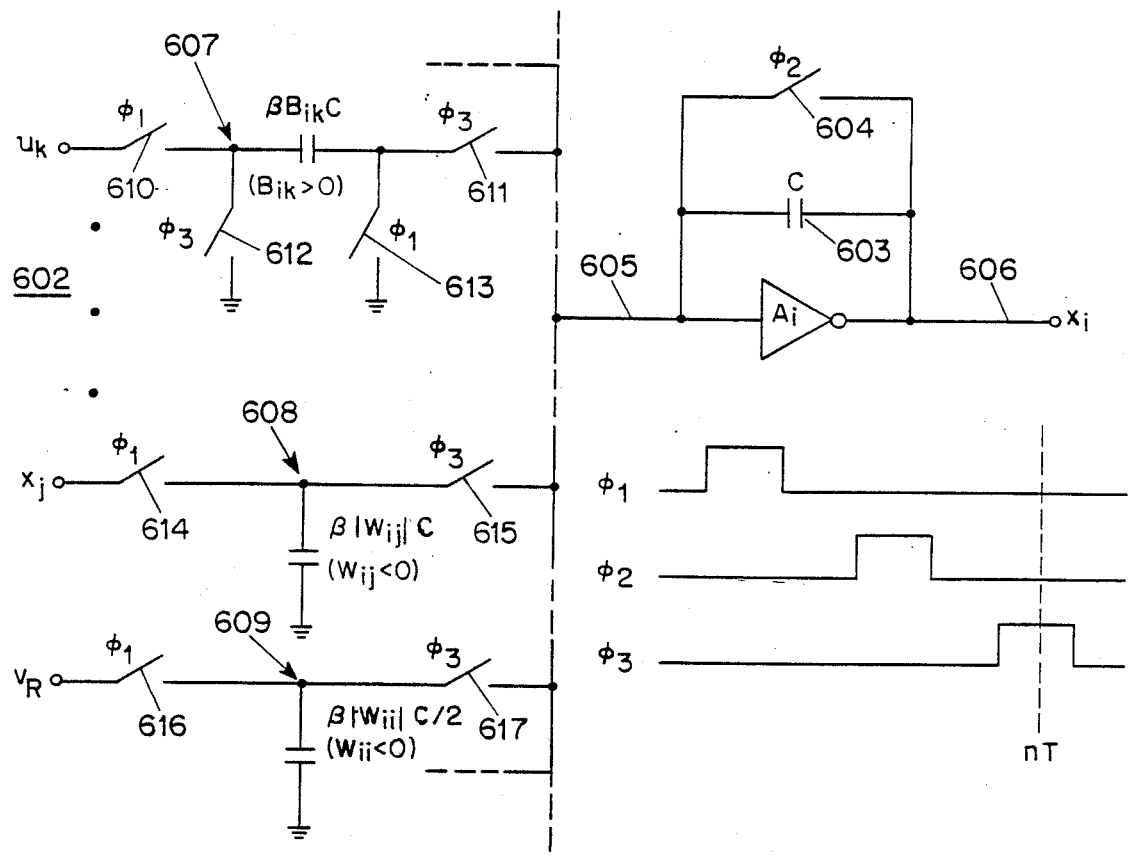
FIG. 6 is a schematic diagram and switching waveforms of one amplifier and input circuit of a neural network implemented with switched-capacitor circuits.

Although the input circuits of the neural network 402 used in the exemplary 1-bit A/D converter of FIG. 4 is implemented with a resistor array, other types of input circuits for providing weighted sums of feedback and external signals to the nonlinear amplifiers of the neural network may be substituted by those skilled in the art. For example, a neural network implemented with nonlinear amplifiers each having switched-capacitor input circuits for providing a weighted sum of feedback and external signals to the amplifier is described in a paper entitled "Switched-Capacitor Neural Networks" by Y. P. Tsividis and the present inventor, published in Electronics Letters Vol. 23 No. 18, pp. 958-959 on Aug. 27, 1987. FIG. 6 shows one amplifier $A_i$ of such a neural network and the switched-capacitor input circuit 602 for providing a weighted sum signal to the amplifier.

With reference to FIG. 6, the amplifier 601, which provides a digital value $x_i$ at its inverted output terminal 606 when the network is in a stable state, has a capacitor 603 of value C and a switch 604, driven by a switching signal $\phi_2$, connected between its output terminal 606 and its input 605. The amplifier $A_i$ has a sigmoid shaped transfer function similar to that shown in FIG. 2. The input 605 of the amplifier $A_i$ can be considered as being at virtual ground.

The input circuit 602 comprises a plurality of switched-capacitor circuits 607-609, each receiving an output signal $x_j$ supplied by another amplifier $A_j$, an analog signal sample $u_k$ and a constant signal $V_R$. A respective weighting factor $W_{ij}$, $B_{ij}$ or $W_{ii}$ is applied to the signal received by each one of the switched-capacitor circuits 607-609. Each switched-capacitor circuit then transfers a weighted signal to the input 605 of the amplifier $A_j$, where the weighted signals are summed.

Two types switched-capacitor circuits are used in the input circuit 602. One type, as illustrated by the circuit 607, applies a weighting factor $B_{ik}$ greater than 0 to a signal received by the circuit, while the other type, as illustrated by the circuits 608 and 609, applies a weighting factor less than 0 to the received signal.

The switches 604, 610-617 are n-channel MOS transistors controlled by periodic, phase related switching signals $\phi_1$, $\phi_2$ and $\phi_3$ supplied to the gate of each transistor. The waveforms of the switching signals $\phi_1$, $\phi_2$ and $\phi_3$ are shown in FIG. 6. Each switch is closed when its controlling switching signal is at a "high" logic level and is open when the controlling signal is at a "low" logic level.

First the signal $\phi_1$ is pulsed "high" for a predetermined interval, during which the values of the analog signal samples, the output signals supplied by other amplifiers and the constant signal are sampled. The samples are stored in the capacitors of respective switched-capacitor circuits 607-609. Following the $\phi_1$ pulse, the signal $\phi_2$ is pulsed "high" to discharge the capacitor 603 across each amplifier $A_i$ and thereby cause the output terminal 606 of the amplifier to go to zero. Thereafter, the signal $\phi_3$ is pulsed "high" to cause the charge stored in each of the capacitors of the circuits 607-609 to be shared with the capacitor 603 in proportion to the ratio of their respective capacitances. In this manner, the signal samples stored in the capacitors of the switched-capacitor circuits 607-609 are weighted in proportion to the capacitance ratio of the capacitor storing the signal sample to the feedback capacitor 603, and the weighted signal samples are summed at the input 605 of the amplifier $A_i$ in each cycle of the switching signal $\phi_3$.

For a switched-capacitor neural network having N amplifiers, the output signal $x_i$ supplied by the amplifier $A_i$ at a discrete time instant nT may be expressed as $$x_i(nT) = f\left[ \sum_{\substack{j=1 \\ i \neq j}}^{N} W_{ij}x_j(nT - T) + \sum_{j=1}^{N} B_{ij}u_j + \tfrac{1}{2}W_{ii}V_R \right], \quad (18)$$

where f[ ] in the present example represents a nonlinearity of the sigmoid shape. As long as the amplifier $A_i$ operates in its linear region, charged conservation dictates that the output signal $x_i$ is given by the quantity inside the brackets of equation (18) multiplied by a gain factor $\beta$. If this quantity exceeds the saturation limits of the amplifier $A_i$, the nonlinearities of the amplifier $A_i$ are taken into account by the sigmoid function f[ ].

A discrete time neural network implemented with switched-capacitor circuits may under some circumstances follow an oscillatory trajectory and for that reason fail to reach a stable state. Therefore, it is advantages to implement the switched-capacitor neural network to have a damping factor $\epsilon$, such that equation (18) becomes verter is to be fabricated in an integrated circuit chip. In general, a neural network having N amplifiers may have up to $N^2$ interconnections in the input circuits between input and output terminals of the amplifiers. However, with a switched-capacitor implementation of the input circuits, many of the direct connections between the output terminals of amplifiers and the input terminals of other amplifiers may be omitted, since the output signals which are otherwise supplied by the omitted connections may be routed indirectly to appropriate input circuits through other connections. The indirectly routed output signals may be temporarily stored in capacitors at each intermediate connection while the signals are passed from one such connection to another leading to the appropriate input circuits.

Moreover, for an A/D converter in accordance with the invention, the weighting factors $W_{ij}$ of the neural network, as exemplified by the elements of the matrix of equation (9), are small or zero where amplifiers $A_i$ and $A_j$ are distant from one another (i.e., $W_{ij}$ is far from the diagonal of the matrix W). Therefore, those weighting factors $W_{ij}$ for which the magnitude of the differences between i and j exceed a certain threshold may be set to zero without significantly altering the stable states of the neural network. In so doing, the total amount of signal routing between input and output terminals of the amplifiers, whether implemented with fully analog or clocked circuitry, in the neural network will be reduced, and the control logic for directing such signal routing, in the case of a clocked circuit implementation, will also be simplified. An example of such truncation of the weighting factors would be a 1-bit A/D converter for digital image halftoning using a small image window (e.g., 5×5 picture elements), in which the nonlinear amplifiers of the neural network are arranged in a two-dimensional array, and interconnections are permitted only between the output terminal of an amplifier and the input circuits (switched capacitor or resistive) of its 24 nearest neighbor amplifiers.

In a manner analogous to a switched-capacitor implementation, as discussed above, a discrete-time neural circuit based on clocked analog circuits may be implemented with charge-coupled devices (CCDs), as would be apparent to those skilled in the art from the foregoing discussion. For the digital image halftoning application a CCD implementation provides special advantages in that the same CCD array may be used to scan an image for deriving the intensity values of pixels and also for providing a nonstandard 1-bit A/D conversion of the pixel intensity values to minimize a distortion measure appropriate for visual perception of halftone renditions of the image.

Another aspect of the invention is nonstandard multiple-bit A/D conversion, in which a block of N samples $u_1, \ldots, u_N$ of a continuous-time analog signal u(t) is converted into N corresponding m-bit binary codes $x_1, \ldots, x_N$ representing the N analog signal samples quan- $$x_i(nT) = x_i(nT - T) + \epsilon \left\{ f\left[ \sum_{\substack{j=1 \\ i \neq j}}^{N} W_{ij}x_j(nT - T) + \sum_{j=1}^{N} B_{ij}u_j + \tfrac{1}{2}W_{ii}V_R \right] - x_i(nT - T) \right\}. \quad (19)$$

A switched-capacitor implementation of the neural network of a nonstandard A/D converter in accordance with the invention may provide significant advantages over the resistor array implementation illustrated in FIG. 4, particularly when such an A/D contized according to $2^m$ predefined uniform reconstruction levels, such that a distortion measure of the form of equation (4) is minimized. Since each analog signal sample $u_n$ is uniformly quantized to m bits, $b_{N,m-1}, b_{N,m-2}, \ldots, b_2, b_1, b_0$, the digital code $x_n$ corresponding to analog signal sample $u_n$ can be linearly related to $$\sum_{k=0}^{k=m-1} 2^k b_{N,k}. \tag{20}$$

The distortion measure of equation (4) will remain quadratic in terms the individual bits $b_{N,k}$, where m and N are integers greater than 1 and having indices $N=0,1,\ldots,N-1$ and $k=0,1,\ldots,m-1$. Therefore, nonstandard m-bit A/D conversion may be implemented as a generalization of the 1-bit A/D converter, as illustrated in FIG. 4, by using a neural network having an array of $m=N$ nonlinear amplifiers.

An advantageous alternative implementation of nonstandard m-bit A/D conversion in accordance with the invention is to use a 1-bit nonstandard A/D converter, as described hereinabove, to minimize a distortion measure of the form $$d(u,x) = [A(u-Q) - B(x'-Q)]^2, \tag{21}$$

where u is an N-dimensional vector consisting of the analog signal samples $u_1, \ldots, u_N$, x' is an N-dimensional vector consisting of analog representations $x'_1, \ldots, x'_N$ of the binary codes $x_1, \ldots, x_N$, Q is an N-dimensional vector consisting of values $Q_1, \ldots, Q_N$ equal to quantization levels closest to but smaller than corresponding values of the u, and A and B are $N \times N$ matrices. An exemplary 3-bit (i.e., $m=3$) A/D converter 700 for converting blocks of nine analog signal samples (i.e., $N=9$) implemented in accordance with the foregoing is depicted in FIG. 7.

Figure 7:
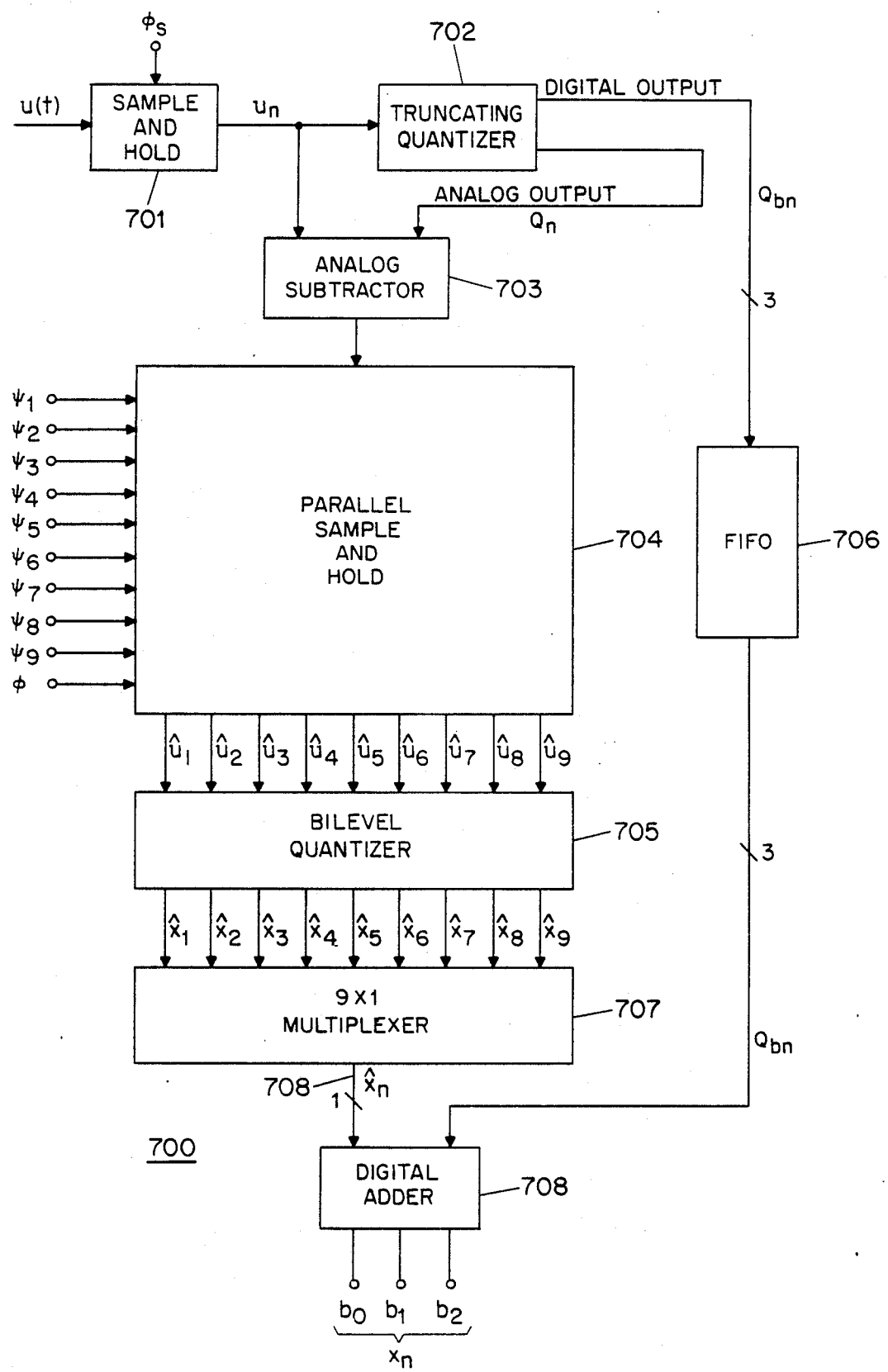
FIG. 7 is a block diagram of a nonstandard multiple-bit A/D converter circuit implemented with a neural network in accordance with another exemplary embodiment of the invention.

Referring to FIG. 7, a continuous-time analog signal $u(t)$ is provided to a conventional sample-and-hold circuit 701, which provides sampled values of $u(t)$ at intervals determined by a sampling clock signal $\phi_s$. A truncating quantizer circuit 702 receives each analog signal sample $u_n$ and provides a quantized value corresponding to $u_n$. The corresponding quantized value, which is provided both as an analog value $Q_n$ and as an equivalent 3-bit binary value $Q_{bn}$, is the one of eight predefined quantization levels which is closest to and smaller than $u_n$.

An analog subtractor 703 receives each analog signal sample $u_n$ and its corresponding analog quantized value $Q_n$, and provides a respective difference value $\hat{u}_n$ to a parallel sample-and-hold circuit 704, which is the same as the circuit 401 of FIG. 4. In response to the nine sampling signals $\psi_1-\psi_9$, which are each in phase relationship to the sampling clock signal $\phi_s$, the circuit 704 sequentially samples and stores all nine of the difference values $\hat{u}_1, \ldots, \hat{u}_9$ provided by the analog subtractor 703 and provides those difference values in parallel to a bilevel quantizer circuit 705 when the output clock signal $\phi$ is at a "high" logic level. The waveforms of the sampling signals $\psi_1-\psi_9$ and the output signal $\phi$ are shown in FIG. 5.

The bilevel quantizer circuit 705, which is the same as the neural network 402 of FIG. 4, provides nine 1-bit binary values $\hat{x}_1, \ldots, \hat{x}_9$ representing a bilevel quantization of the difference values $\hat{u}_1, \ldots, \hat{u}_9$ which provides the minimum or near minimum of the distortion measure $d(\hat{u},\hat{x}) = (\hat{u}-B\hat{x})^T(\hat{u}-B\hat{x})$, where $\hat{u}$ is a vector consisting of the difference values $\hat{u}_1, \ldots, \hat{u}_9$, x is a vector consisting of the 1-bit binary values $\hat{x}_1, \ldots, \hat{x}_9$ and B is the matrix of equation (6). Since $\hat{u}=u-Q$ and $\hat{x}=x-Q_b$, where $Q_b$ is an N-dimensional vector consisting of values which are binary representations of corresponding values of Q, the above-specified distortion measure has the form of equation (21), with A being a unit matrix.

The 1-bit binary values $\hat{x}_1, \ldots, \hat{x}_9$ from the bilevel quantizer circuit 705 are received by a conventional multiplexer 707, which sequentially supplies the binary values one at a time at its output terminal 708.

The 3-bit binary representations $Q_{b1}, \ldots, Q_{b9}$ of the quantized values $Q_1, \ldots, Q_9$ corresponding to the analog signal samples $u_1, \ldots, u_9$, as supplied by the truncating quantizer 702, are stored in sequence in a convention FIFO register stack 706 having the capacity for storing nine 3-bit binary values and for providing the stored values on a first-in, first-out basis. The sequentially stored binary values $Q_{b1}, \ldots, Q_{b9}$ in the FIFO register stack 706 are provided one at a time to a conventional digital adder circuit 708, which simultaneously receives a corresponding 1-bit binary values $\hat{x}_1, \ldots, \hat{x}_9$ from the multiplexer 707. The digital adder 706 adds each 3-bit binary value $Q_{bn}$ to its corresponding 1-bit binary value $\hat{x}_N$ and supplies a 3-bit output code $x_n$ corresponding to the analog signal sample $u_n$. In the foregoing manner the exemplary nonstandard A/D converter of FIG. 7 converts a block u of nine analog samples of a continuous-time signal $u(t)$ into a corresponding block x of nine 3-bit binary codes, such that the distortion measure of equation (21) is at a global or local minimum.

As explained hereinabove in connection with the 1-bit A/D converter of FIG. 4, the neural network of the bilevel quantizer 705 may have a discrete time implementation using clocked analog circuits, such as switched-capacitor circuits or CCD circuits.

Figure 8:
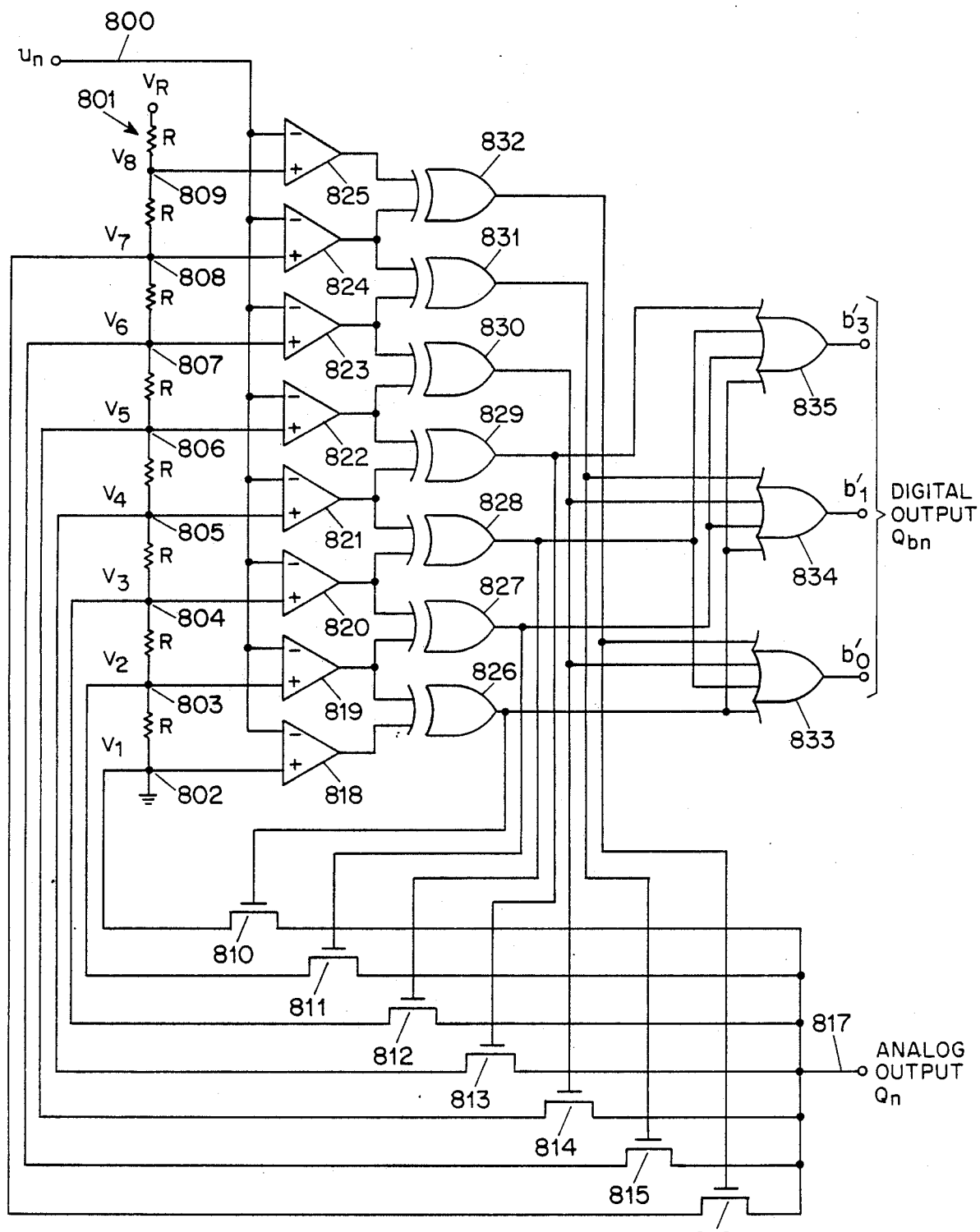
FIG. 8 is a schematic diagram of an exemplary truncating quantizer circuit 602, as used in the multiple-bit A/D converter circuit of FIG. 7.

Turning now to FIG. 8, there is shown a schematic diagram of the truncating quantizer circuit 702 used in the 3-bit A/D converter of FIG. 7. The circuit includes an input terminal 800 receiving an analog signal sample $u_n$ and a resistor divider chain 801 connected between a reference voltage $V_R$ and ground. The resistor divider chain 801, which has eight resistors R of equal value, provides eight uniform quantization levels $V_1-V_8$ at nodes 802-809, respectively. The quantization levels $V_1-V_7$ at nodes 802-808, respectively are connected to corresponding n-channel MOS transistors 810-816, which are each also connected to an analog output terminal 817. The MOS transistors 810-816 each serve as a switch which closes when a "high" logic level signal is applied to its gate and which opens when a "low" logic level is so applied.

The truncating quantizer circuit 702 further includes eight conventional analog comparators 818-825, each having its negative input connected to the input terminal 800 for receiving an analog signal sample $u_n$ and its positive input connected to a node of the resistor divider chain 801 for receiving a respective one of the quantization levels $V_1-V_8$. Each comparator provides a "high" logic level at its output when $u_n$ is greater than the quantization level received by the comparator and a "low" logic level when $u_n$ is less than the received quantization level. Thus, for a given value of $u_n$, each comparator receiving a quantization level less than $u_n$ provides a "low" logic level at its output, while each comparator receiving a quantization level greater than $u_n$ provides a "high" logic level at its output.

Also included in the truncating quantizer circuit 702 are seven 2-input EXCLUSIVE-OR gates 826–832. Each EXCLUSIVE-OR gate has its inputs connected to the outputs of a pair of comparators receiving two successive quantization levels and its output connected to the gate of the MOS transistor for connecting the smaller of the two successive quantization levels to the analog output terminal 817. Thus, for a value of $u_n$ which lies between two successive quantization levels, only the EXCLUSIVE-OR gate connected to the outputs of the pair of comparators receiving the two successive quantization levels which are respectively greater and smaller tha $u_n$ provides a "high" logic level to the gate of the transistor for connecting the smaller of the two quantization levels to the analog output terminal 818.

For example, if a particular analog signal sample $u_n$ has a value between quantization levels $V_5$ and $V_6$, the outputs of comparators 818–822 will each be at a "low" logic level, while the outputs of comparators 823–825 will each be at a "high" logic level. Under these conditions, only the EXCLUSIVE-OR gate 830 will receive different logic levels at its inputs and thus provide a "high" logic level to the gate of the transistor 813, which is for connecting the quantization level $V_5$ at node 806 to the output terminal 817. Since a "high" logic level applied to the gate of transistor 813 drives it to a conducting state, the quantization level $V_5$, which is closest to and smaller than $u_n$, is supplied by the analog output 817 of the circuit 702.

Three 4-input NOR gates 833–835 forming part of the circuit 702 are connected to decode the outputs of the EXCLUSIVE-OR gates 826–832 to provide a 3-bit binary representation $Q_{bn}$ of the quantization level $Q_n$ supplied at the analog output 817. The outputs of the NOR gates 833–835 serve as the digital output of the truncating quantizer circuit 702.

While the invention has been described with reference to exemplary embodiments thereof, it will be understood by those skilled in the art that various modifications and alterations may be made to the described embodiments without departing from the scope of the invention which is defined by the appended claims. For example, the transfer functions g(u) of the nonlinear amplifiers of the neural network need not be strictly a sigmoid function, but may be another appropriate nonlinear function, such as $g(u)=f(u-\frac{1}{2})-u$, where f(u) is the sigmoid function, if u is normally in the interval (0,1). If the chosen interval is (−1,1), then $g(u)=-f(u)-u$. It should be noted that these choices correspond to a generalization of the error-diffusion digital halftoning algorithm, so that the interconnections among processing elements are bidirectional, resulting in a symmetric network.

I claim:

1. A nonstandard analog-to-digital converter for converter a sampled analog signal u, having N samples $u_1, \ldots, u_N$ each with a value between a first and a second level, into a digital signal x, having N corresponding 1-bit binary values $x_1, \ldots, x_N$, such that a distortion measure $d=(Au-Bx)^T(Au-Bx)$ is minimized, where u and x are N-dimensional vectors, A and B are N×N matrices, and N is an integer greater than 1, the converter comprising:

N nonlinear amplifying means $A_1, \ldots, A_N$, each having an output terminal supplying an output signal and input means operatively coupled to receive the output signals supplied by other amplifying means, one or more of the analog signal samples and a respective constant signal, the input means for taking the weighted sum of the signals received thereby, including applying respective weighting factors to the received signals, and providing the weighted sum to the amplifying means, wherein for any two of the N amplifying means $A_i$ and $A_j$, where i and j are independent integers having values $i=1, 2, \ldots N$ and $j=1, 2, \ldots, N$, the weighting factor $W_{ij}$ applied by the input means of $A_i$ to the output signal supplied by $A_j$ is the element of the $i^{th}$ row and $j^{th}$ column of a matrix $-B^TB$, the weighting factor $K_{ij}$ applied by the input means of $A_i$ to analog signal example $u_j$ is the element of the $i^{th}$ row and $j_{th}$ column of a matrix $B^T$, the constant signal $I_i$ received by the input means of $A_i$ is the element of the $i^{th}$ row and $i^{th}$ column of the matrix $-B^TB$, and the output signal supplied by $A_i$ operatively stabilizes to binary value $x_i$ of the digital signal x.

2. An analog-to-digital converter according to claim 1, wherein each of the amplifying means has a sigmoid transfer function.

3. An analog-to-digital converter according to claim 2, wherein the input means of each amplifying means includes a plurality of resistance means.

4. An analog-to-digital converter according to claim 3, wherein the input means of each amplifying means $A_i$ includes a resistance $R_{ij}$ corresponding to each weighting factor $W_{ij}$ which is not equal to zero, the value of $R_{ij}$ being proportional to $1/|W_{ij}|$.

5. An analog-to-digital converter according to claim 4, wherein the input means of each amplifying means $A_i$ further includes a resistance $R_{Iij}$ corresponding to each weighting factor $K_{ij}$ which is not equal to zero, the value of $R_{Iij}$ being proportioned to $1/|K_{ij}|$.

6. An analog-to-digital converter according to claim 5, wherein the input means of each amplifying means $A_i$ further includes a resistance $R_{ci}$ operatively coupled to a reference voltage $V_R$, the value of $R_{ci}$ being proportional to $V_R/I_i$.

7. An analog-to-digital converter according to claim 2, wherein the input means of each amplifying means includes a plurality of switched capacitance means.

8. An analog-to-digital converter according to claim 7, wherein each amplifying means $A_i$ includes a capacitance C coupled between the output terminal and an input node thereof, and the input means of each amplifying means $A_i$ includes a capacitance $C_{ij}$ corresponding to each weighting factor $W_{ij}$ which is not equal to zero, the value of $C_{ij}$ being proportional to $|W_{ij}|C$.

9. An analog-to-digital converter according to claim 8, wherein the input means of each amplifying means $A_i$ further includes a capacitance $C_{ij}$ corresponding to each weighting factor $K_{ij}$ which is not equal to zero, the value of $C_{ii}$ being proportional to $|K_{ij}|C$.

10. An analog-to-digital converter according to claim 9, wherein the input means of each amplifying means $A_i$ further includes a capacitance $C_{ci}$, the value of $C_{ci}$ being proportional to $|I_i|C$.

11. A method for converting a discrete analog signal u, having N samples $u_1, \ldots, u_N$ each with a value between a first and a second level, into a digital signal x, having N corresponding 1-bit binary values $x_1, \ldots, x_N$, such that a distortion measure $d=(Au-Bx)^T(Au-Bx)$ is minimized, where u and x are N-dimensional vectors, A and B are N×N matrices and N is an integer greater than 1, the method comprising the steps of:

providing N nonlinear amplifying means $A_1, \ldots, A_N$, each receiving an input signal and supplying an output signal which is a sigmoid function of the input signal; and forming the input signal for each amplifying means by weighting the output signals supplied by other amplifying means and one or more of the analog signal samples by applying respective weighting factors thereto and summing the weighted output signals, the weighted analog signal sample and a respective constant signal, wherein for any two of the N amplifying means $A_i$ and $A_j$, where i and j are independent integers having values $i = 1, 2, \ldots, N$ and $j = 1, 2, \ldots, N$, the weighting factor $W_{ij}$ applied to the output signal supplied by $A_j$ in forming the input signal for $A_i$ is the element of the $i^{th}$ row and $j^{th}$ column of a matrix $-B^TB$, the weighting factor $K_{ij}$ applied to the analog signal sample $u_j$ in forming the input signal for $A_i$ is the element of the $i^{th}$ row and $j^{th}$ column of a matrix $B^T$, the respective constant signal $I_i$ of the input signal for $A_i$ is the element of the $i^{th}$ row and $i^{th}$ column of the matrix $-B^TB$, and the output signal supplied by $A_i$ operatively stabilizes to binary value $x_i$ of the digital signal x.

12. A method according to claim 11, wherein the step of forming the input signal for each amplifying means $A_i$ includes providing a resistance $R_{ij}$ corresponding to each weighting factor $W_{ij}$ which is not equal to zero, the value of $R_{ij}$ being proportional to $1/|W_{ij}|$.

13. A method according to claim 12, wherein the step of forming the input signal for each amplifying means $A_i$ includes providing a resistance $R_{Iij}$ corresponding to each weighting factor $K_{ij}$ which is not equal to zero, the value of $R_{ii}$ being proportional to $1/|K_{ij}|$.

14. A method according to claim 13, wherein the step of forming the input signal for each amplifying means $A_i$ includes providing a reference voltage $V_R$ and a resistance $R_{ci}$ corresponding to the respective constant signal $I_i$, the value of $R_{ci}$ being proportional to $V_R/I_i$.

15. A method according to claim 11, wherein the step of forming the input signal for each amplifying means $A_i$ includes providing a capacitance C operatively coupled between an input and an output of $A_i$ and switch capacitance means corresponding to each weighting factor $W_{ij}$ and $K_{ij}$, the switched capacitance means corresponding to $K_{ij}$ including a capacitance $C_{ij}$ having a value proportional to $|W_{ij}|C$ and the switched capacitance means corresponding to $K_{ij}$ including a capacitance $C_{Iij}$ having a value proportional to $|K_{ij}|C$.

16. A method according to claim 15, wherein the step of forming the input signal for each amplifying means $A_i$ includes providing switched capacitor means corresponding to the respective constant signal $I_i$ and including a capacitance $C_{ci}$ having a value proportional to $|I_i|C$.

17. A nonstandard analog-to-digital converter for converting a discrete analog signal u having N samples $u_1, \ldots, u_N$, into a digital signal x, having N corresponding m-bit binary values $x_1, \ldots, x_N$, each equal to one of $2^m$ predefined quantization levels, such that a distortion functions $d = [A(u-Q) - B(x'-Q)]^2$ is minimized, where N and m are integers greater than 1, u and x' are N-dimensional vectors having values $u_1, \ldots, u_N$ and analog representations $x'_1, \ldots, x'_N$ of the binary values $x_1, \ldots, x_N$, respectively, Q is an N-dimensional vector having first quantized values $Q_1, \ldots, Q_N$ equal to quantization levels closest to and smaller than corresponding samples of u, and A and B are $N \times N$ matrices, the converter comprising:

truncating quantizer means operatively coupled to receive the analog signal samples $u_1, \ldots, u_N$ for providing the first quantized values $Q_1, \ldots Q_N$ and binary representations $Q_{b1}, \ldots Q_{bN}$ of the first quantized values;

analog subtraction means operatively coupled to receive the analog signal samples $u_1, \ldots, u_N$ and the first quantized values $Q_1, \ldots, Q_N$ for taking the difference between corresponding ones of the analog signal samples and the first quantized values to provide respective difference values $\hat{u}_1, \ldots, \hat{u}_N$, where each difference value $\hat{u}_i$ is equal to $u_i - Q_i$ for $i = 1, 2, \ldots, N$;

N nonlinear amplifying means $A_1, \ldots, A_N$, each having an output terminal supplying an output signal and input means operatively coupled to receive the output signals supplied by other amplifying means, one or more of the difference values and a respective constant signal, the input means for taking the weighted sum of the signals received thereby, including applying respective weighting factors to the received signals and providing the weighted sum to the amplifying means, wherein for any two of the N amplifying means $A_i$ and $A_j$, where i and j are independent integers having values $i = 1, 2, \ldots, N$ and $j = 1, 2, \ldots, N$, the weighting factor $W_{ij}$ applied by the input means of $A_i$ to the output signal supplied by $A_j$ is the element of the $i^{th}$ row and $j^{th}$ column of a matrix $-B^TB$, the weighting factor $K_{ij}$ applied by the inputs means of $A_i$ to $u_j$ is the element of the $i^{th}$ row and $j^{th}$ column of a matrix $B^T$, and the respective constant signal $I_i$ received by the input means of $A_i$ is the element of the $i^{th}$ row and $i^{th}$ column of the matrix $-B^TB$; and digital adder means coupled to receive the output signals supplied by the N amplifying means and the binary representations $Q_{b1}, \ldots, Q_{bN}$ of the first quantized values provided by the truncating quantizer means for summing the output signal supplied by each amplifying means $A_i$ and the binary representation $Q_{bi}$ corresponding to analog signal sample $u_i$ to provide a binary value $x_i$ of the signal x.

18. An analog-to-digital converter according to claim 17, wherein each of the amplifying means has a sigmoid transfer function.

19. An analog-to-digital converter according to claim 18, wherein the input means of each amplifying means includes a plurality of resistance means.

20. An analog-to-digital converter according to claim 19, wherein the input means of each amplifying means $A_i$ includes a resistance $R_{ij}$ corresponding to each weighting factor $W_{ij}$ which is not equal to zero, the value of $R_{ij}$ being proportional to $1/|W_{ij}|$.

21. An analog-to-digital converter according to claim 20, wherein the input means of each amplifying means $A_i$ further includes a resistance $R_{Iij}$ corresponding to each weighting factor $K_{ij}$ which is not equal to zero, the value of $R_{Iij}$ being proportional to $1/|K_{ij}|$.

22. An analog-to-digital converter according to claim 21, wherein the input means of each amplifying means $A_i$ further includes a resistance $R_{ci}$ operatively coupled to a reference voltage $V_R$, the value of $R_{ci}$ being proportional to $V_R/I_i$.

23. An analog-to-digital converter according to claim 18, wherein the input means of each amplifying means includes a plurality of switched capacitance means.

24. An analog-to-digital converter according to claim 23, wherein each amplifying means $A_i$ includes a capacitance C operatively coupled between the output terminal and an input node thereof, and the input means of each amplifying means $A_i$ includes a capacitance $C_{ij}$ corresponding to each weighting factor $W_{ij}$ which is not equal to zero, the value of $C_{ij}$ being proportional to $|W_{ij}|C$.

25. An analog-to-digital converter according to claim 24, wherein the input means of each amplifying means $A_i$ further includes a capacitance $C_{Iij}$ corresponding to each weighting factor $K_{ij}$ which is not equal to zero, the value of $C_{Iij}$ being proportional to $|K_{ij}|C$.

26. An analog-to-digital converter according to claim 25, wherein the input means of each amplifying means $A_i$ further includes a capacitance $C_{ci}$, the value of $C_{ci}$ being proportional to $|I_i|C$.

27. A method for converting a discrete analog signal u, having N samples $u_1, \ldots, u_N$, into a digital signal x having N corresponding m-bit binary values $x_1, \ldots, x_N$ each equal to one of $2^m$ predefined quantization levels, such that a distortion function $d = [A(u-Q) - B(x'-Q)]^T[A(u-Q) - B(x'-Q)]$ is minimized, where N and m are integers greater than 1, u and x' are N-dimensional vectors having values $u_1, \ldots, U_N$ and analog representations $x_1', \ldots x_N'$ of the binary values $x_1, \ldots, x_N$, respectively, Q is an N-dimensional vector having values $Q_1, \ldots, Q_N$ equal to quantization levels closest to and smaller than corresponding values of u, and A and B are $N \times N$ matrices, the method comprising the steps of:

deriving N first quantized values $Q_1, \ldots, Q_N$ corresponding to the N analog signal samples $u_1, \ldots, u_N$, each of the first quantized values being the quantization level closest to and smaller than its corresponding analog signal sample;

deriving N binary representations $Q_{b1}, \ldots, Q_{bN}$ of the first quantized values $Q_1, \ldots, Q_N$;

subtracting each of the first quantized values from its corresponding analog signal sample to obtain a difference value corresponding to the analog signal sample, where each difference value $\hat{u}_i$ is equal to $u_i - Q_i$ for $i = 1, 2, \ldots, N$;

providing N nonlinear amplifying means $A_1, \ldots, A_N$, each receiving an input signal and providing an output signal which is a sigmoid function of the input signal;

forming the input signal for each amplifying means by weighting the output signals supplied by other amplifying means and a respective one or more of the difference values by applying respective weighting factors thereto and summing the weighted output signals, the weighted difference values, and a respective constant signal, wherein for any two of the N amplifying means $A_i$ and $A_j$, where i and j are independent integers having values $i = 1, 2, \ldots, N$ and $j = 1, 2, \ldots, N$, the weighting factor $W_{ij}$ applied to the output signal supplied by $A_j$ in forming the input signal for $A_i$ is the element of the $i^{th}$ row and $j^{th}$ column of a matrix $-B^TB$, the weighting factor $K_{ij}$ applied to the difference value $u_j$ in forming the input signal for $A_i$ is the element of the $i^{th}$ row and $j^{th}$ column of a matrix $B^T$, the respective constant signal $I_i$ of the input signal for $A_i$ is the element of the $i^{th}$ row and $i^{th}$ column of the matrix $-B^TB$; and summing the output signal supplied by each amplifying means $A_i$ and binary representation $Q_{bi}$ corresponding to analog signal sample $U_i$ to obtain a corresponding binary value $x_i$ of the digital signal x.

28. A method according to claim 27, wherein the step of forming the input signal for each amplifying means $A_i$ includes providing a resistance $R_{ij}$ corresponding to each weighting factor $W_{ij}$ which is not equal to zero, the value of $R_{ij}$ being proportional to $1/|W_{ij}|$.

29. A method according to claim 28, wherein the step of forming the input signal for each amplifying means $A_i$ includes providing a resistance $R_{Iij}$ corresponding to each weighting factor $K_{ij}$ which is not equal to zero, the value of $R_{Iij}$ being proportional to $1/|K_{ij}|$.

30. A method according to claim 29, wherein the step of forming the input signal for each amplifying means $A_i$ includes providing a reference voltage $V_R$ and a resistance $R_{ci}$ corresponding to the constant signal $I_i$, the value of $R_{ci}$ being proportional to $V_R/I_i$.

31. A method according to claim 27, wherein the step of forming the input signal for each amplifying means $A_i$ includes providing a capacitance C operatively coupled between an input and an output of each amplifying means $A_i$ and switch capacitance means corresponding to each weighting factor $W_{ij}$ and $K_{ij}$, the switched capacitance means corresponding to $W_{ij}$ including a capacitance $C_{ij}$ having a value proportional to $|W_{ij}|C$ and the switched capacitance means corresponding to $K_{ij}$ including a capacitance $C_{Iij}$ having a value proportional to $|K_{ij}|C$.

32. A method according to claim 31, wherein the step of forming the input signal for each amplifying means $A_i$ includes providing switched capacitance means corresponding to the constant signal $I_i$ and including a capacitance $C_{ci}$ having a value proportional to $|I_i|C$.

* * * * *

UNITED STATES PATENT AND TRADEMARK OFFICE
CERTIFICATE OF CORRECTION

PATENT NO. : 4,926,180

DATED : May 15, 1990

INVENTOR(S) : Dimitris Anastassiou

It is certified that error appears in the above-identified patent and that said Letters Patent is hereby corrected as shown below:

First page, penultimate line of ABSTRACT, "for" should read -- the --. Col. 2, line 59, "amplifer" should read -- amplifiers --. Col. 3, line 4, "publisehd" should read -- published --; line 14, "$T_i$" should read -- $I_i$ --; line 28, "resistance" should read -- resistors --; line 47, "shortcoming" should read -- shortcomings --. Col. 4, line 9, "$i^{th}$ column" should read -- $j^{th}$ column --; line 46, "an" should read -- of an --; line 50, "a" should read -- of a --; line 50, "$|I_{ci}|C$" should read -- $|I_{ci}|C$ --. Col. 5, line 10, "samples" should read -- sample --; line 12, first occurrence, "$u_n$" should read -- $\hat{u}_n$ --; line 27, "is" should read -- of --; line 28, "independnet" should read -- independent --; line 35, "$i^{th}$ column" should read -- $j^{th}$ column --. Col. 10, line 48, "$i^{th}$ column" should read -- $j^{th}$ column --; line 63, after "proportional" insert -- to --. Col. 12, line 9, "closed" should read -- close --; line 26, "o the" should read -- of the --; line 66, "$A_j$" should read -- $A_i$ --. Col. 13, line 45, "charged" should read -- charge --; lines 54-55, "advantages" should read -- advantageous --. Col. 15, line 10, "terms" should read -- terms of --; line 16, "m=N" should read -- mxN --; line 55, "$u_1,...,u_9$" should read -- $\hat{u}_1,...,\hat{u}_9$ --; line 67, "x" should read -- $\hat{x}$ --.

UNITED STATES PATENT AND TRADEMARK OFFICE
CERTIFICATE OF CORRECTION

PATENT NO. : 4,926,180

DATED : May 15, 1990

INVENTOR(S) : Dimitris Anastassiou

It is certified that error appears in the above-identified patent and that said Letters Patent is hereby corrected as shown below:

Col. 16, line 21, after "receives" delete "a". Col. 17, line 13, "tha" should read -- than --; lines 56-57, "converter" should read -- converting --. Col. 18, line 17, "$i^{th}$ column" should read -- $j^{th}$ column --; line 36, "proportioned" should read -- proportional --. Col. 19, line 22, "$i^{th}$ column" should read -- $j^{th}$ column --; line 62, "functions" should read -- function --. Col. 20, line 36, "$i^{th}$ column" should read -- $j^{th}$ column --. Col. 22, line 10, "$u_j$" should read -- $\hat{u}_j$ --; line 13, "$i^{th}$" (second occurrence) should read -- $j^{th}$ --.

Signed and Sealed this

Twenty-sixth Day of November, 1991

Attest:

HARRY F. MANBECK, JR.

*Attesting Officer*          *Commissioner of Patents and Trademarks*